US008373718B2

(12) United States Patent
Dutta et al.

(10) Patent No.: US 8,373,718 B2
(45) Date of Patent: Feb. 12, 2013

(54) METHOD AND SYSTEM FOR COLOR ENHANCEMENT WITH COLOR VOLUME ADJUSTMENT AND VARIABLE SHIFT ALONG LUMINANCE AXIS

(75) Inventors: Santanu Dutta, Sunnyvale, CA (US); Christos Chrysafis, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 742 days.

(21) Appl. No.: 12/332,269

(22) Filed: Dec. 10, 2008

(65) Prior Publication Data

US 2010/0141671 A1 Jun. 10, 2010

(51) Int. Cl.

| | |
|---|---|
| ***G09G 5/00*** | (2006.01) |
| ***G09G 5/02*** | (2006.01) |
| ***H03L 7/00*** | (2006.01) |
| ***H04N 5/46*** | (2006.01) |
| ***G03F 3/08*** | (2006.01) |
| ***G06K 9/00*** | (2006.01) |
| ***G06K 9/40*** | (2006.01) |
| *H04N 5/14* | (2006.01) |
| *H04N 5/202* | (2006.01) |
| *H04N 1/46* | (2006.01) |

(52) U.S. Cl. ........ 345/589; 345/591; 345/604; 345/606; 345/619; 348/254; 348/538; 348/557; 348/671; 358/518; 358/520; 358/525; 382/162; 382/167; 382/254; 382/274

(58) Field of Classification Search .......... 345/427–428, 345/581, 589–591, 593–594, 600–601, 604, 345/606, 618–619, 538, 549; 348/179, 254, 348/488, 538, 557–560, 630, 663, 671, 674, 348/447–448; 358/518–520, 523–525; 382/162–167

See application file for complete search history.

(56) References Cited

U.S. PATENT DOCUMENTS

| | | | |
|---|---|---|---|
| 3,904,818 | A | 9/1975 | Kovac |
| 4,253,120 | A | 2/1981 | Levine |
| 4,646,251 | A | 2/1987 | Hayes et al. |
| 4,682,664 | A | 7/1987 | Kemp |
| 4,685,071 | A | 8/1987 | Lee |
| 4,739,495 | A | 4/1988 | Levine |
| 4,771,470 | A | 9/1988 | Geiser et al. |

(Continued)

FOREIGN PATENT DOCUMENTS

| | | |
|---|---|---|
| CN | 1275870 | 12/2000 |
| EP | 0392565 | 10/1990 |

(Continued)

OTHER PUBLICATIONS

Loop, C., DeRose, T., Generalized B-Spline surfaces o arbitrary topology, Aug. 1990, SIGRAPH 90, pp. 347-356.

(Continued)

*Primary Examiner* — Wesner Sajous

(57) ABSTRACT

Embodiments of the claimed subject matter provide a system and process for enhancing the display of color in a graphical display. In one embodiment, a process is provided for color enhancement using a detection volume and a shift volume. In one embodiment, input from pixels, as color data, is compared to a detection volume. If the color data of an input is detected in the detection volume, the color data is modified to a corresponding position in the shift volume, the modification consisting of an enhancement to the original color.

20 Claims, 9 Drawing Sheets

Exemplary Process 500

U.S. PATENT DOCUMENTS

| | | | |
|---|---|---|---|
| 4,803,477 A | 2/1989 | Miyatake et al. | |
| 4,920,428 A | 4/1990 | Lin et al. | |
| 4,987,496 A | 1/1991 | Greivenkamp, Jr. | |
| 5,175,430 A | 12/1992 | Enke et al. | |
| 5,227,789 A | 7/1993 | Barry et al. | |
| 5,261,029 A | 11/1993 | Abi-Ezzi et al. | |
| 5,305,994 A | 4/1994 | Matsui et al. | |
| 5,338,901 A | 8/1994 | Dietrich | |
| 5,387,983 A | 2/1995 | Sugiura et al. | |
| 5,414,824 A | 5/1995 | Grochowski | |
| 5,475,430 A | 12/1995 | Hamada et al. | |
| 5,513,016 A | 4/1996 | Inoue | |
| 5,608,824 A | 3/1997 | Shimizu et al. | |
| 5,652,621 A | 7/1997 | Adams, Jr. et al. | |
| 5,736,987 A | 4/1998 | Drucker et al. | |
| 5,793,371 A | 8/1998 | Deering | |
| 5,793,433 A | 8/1998 | Kim et al. | |
| 5,822,452 A | 10/1998 | Tarolli et al. | |
| 5,831,625 A | 11/1998 | Rich et al. | |
| 5,831,640 A | 11/1998 | Wang et al. | |
| 5,835,097 A | 11/1998 | Vaswani et al. | |
| 5,841,442 A | 11/1998 | Einkauf et al. | |
| 5,878,174 A | 3/1999 | Stewart et al. | |
| 5,892,517 A | 4/1999 | Rich | |
| 5,903,273 A | 5/1999 | Mochizuki et al. | |
| 5,963,984 A | 10/1999 | Garibay, Jr. et al. | |
| 5,995,109 A | 11/1999 | Goel et al. | |
| 6,016,474 A | 1/2000 | Kim et al. | |
| 6,052,127 A | 4/2000 | Vaswani et al. | |
| 6,078,331 A | 6/2000 | Pulli et al. | |
| 6,078,334 A | 6/2000 | Hanaoka et al. | |
| 6,118,547 A | 9/2000 | Tanioka | |
| 6,128,000 A | 10/2000 | Jouppi et al. | |
| 6,141,740 A | 10/2000 | Mahalingaiah et al. | |
| 6,151,457 A | 11/2000 | Kawamoto | |
| 6,175,430 B1 | 1/2001 | Ito | |
| 6,184,893 B1 | 2/2001 | Devic et al. | |
| 6,236,405 B1 | 5/2001 | Schilling et al. | |
| 6,252,611 B1 | 6/2001 | Kondo | |
| 6,281,931 B1 | 8/2001 | Tsao et al. | |
| 6,289,103 B1 | 9/2001 | Sako et al. | |
| 6,298,169 B1 | 10/2001 | Guenter | |
| 6,314,493 B1 | 11/2001 | Luick | |
| 6,319,682 B1 | 11/2001 | Hochman | |
| 6,323,934 B1 | 11/2001 | Enomoto | |
| 6,339,428 B1 | 1/2002 | Fowler et al. | |
| 6,392,216 B1 | 5/2002 | Peng-Tan | |
| 6,396,397 B1 | 5/2002 | Bos et al. | |
| 6,438,664 B1 | 8/2002 | McGrath et al. | |
| 6,469,707 B1 | 10/2002 | Voorhies | |
| 6,486,971 B1 | 11/2002 | Kawamoto | |
| 6,504,952 B1 | 1/2003 | Takemura et al. | |
| 6,549,997 B2 | 4/2003 | Kalyanasundharam | |
| 6,556,311 B1 * | 4/2003 | Benear et al. | 358/1.9 |
| 6,584,202 B1 | 6/2003 | Montag et al. | |
| 6,594,388 B1 | 7/2003 | Gindele et al. | |
| 6,683,643 B1 | 1/2004 | Takayama et al. | |
| 6,707,452 B1 | 3/2004 | Veach | |
| 6,724,932 B1 | 4/2004 | Ito | |
| 6,737,625 B2 | 5/2004 | Baharav et al. | |
| 6,760,080 B1 | 7/2004 | Moddel et al. | |
| 6,785,814 B1 | 8/2004 | Usami et al. | |
| 6,806,452 B2 | 10/2004 | Bos et al. | |
| 6,819,793 B1 | 11/2004 | Reshetov et al. | |
| 6,839,062 B2 | 1/2005 | Aronson et al. | |
| 6,839,813 B2 | 1/2005 | Chauvel | |
| 6,856,441 B2 | 2/2005 | Zhang et al. | |
| 6,859,208 B1 | 2/2005 | White | |
| 6,876,362 B1 | 4/2005 | Newhall, Jr. et al. | |
| 6,883,079 B1 | 4/2005 | Priborsky | |
| 6,891,543 B2 | 5/2005 | Wyatt | |
| 6,900,836 B2 | 5/2005 | Hamilton, Jr. | |
| 6,940,511 B2 | 9/2005 | Akenine-Moller et al. | |
| 6,950,099 B2 | 9/2005 | Stollnitz et al. | |
| 7,009,639 B1 | 3/2006 | Une et al. | |
| 7,015,909 B1 | 3/2006 | Morgan, III et al. | |
| 7,023,479 B2 | 4/2006 | Hiramatsu et al. | |
| 7,081,898 B2 * | 7/2006 | Sevigny | 345/589 |
| 7,082,508 B2 | 7/2006 | Khan et al. | |
| 7,088,388 B2 | 8/2006 | MacLean et al. | |
| 7,092,018 B1 | 8/2006 | Watanabe | |
| 7,106,368 B2 | 9/2006 | Daiku et al. | |
| 7,107,441 B2 | 9/2006 | Zimmer et al. | |
| 7,116,335 B2 | 10/2006 | Pearce et al. | |
| 7,120,715 B2 | 10/2006 | Chauvel et al. | |
| 7,133,072 B2 | 11/2006 | Harada | |
| 7,146,041 B2 | 12/2006 | Takahashi | |
| 7,221,779 B2 | 5/2007 | Kawakami et al. | |
| 7,227,586 B2 | 6/2007 | Finlayson et al. | |
| 7,236,649 B2 | 6/2007 | Fenney | |
| 7,245,319 B1 | 7/2007 | Enomoto | |
| 7,305,148 B2 | 12/2007 | Spampinato et al. | |
| 7,343,040 B2 | 3/2008 | Chanas et al. | |
| 7,397,946 B2 | 7/2008 | Reshetov et al. | |
| 7,447,869 B2 | 11/2008 | Kruger et al. | |
| 7,486,844 B2 | 2/2009 | Chang et al. | |
| 7,502,505 B2 | 3/2009 | Malvar et al. | |
| 7,519,781 B1 | 4/2009 | Wilt | |
| 7,545,382 B1 | 6/2009 | Montrym et al. | |
| 7,580,070 B2 | 8/2009 | Yanof et al. | |
| 7,627,193 B2 | 12/2009 | Alon et al. | |
| 7,671,910 B2 | 3/2010 | Lee | |
| 7,728,880 B2 | 6/2010 | Hung et al. | |
| 7,750,956 B2 | 7/2010 | Wloka | |
| 7,760,936 B1 | 7/2010 | King et al. | |
| 7,912,279 B2 | 3/2011 | Hsu et al. | |
| 8,049,789 B2 | 11/2011 | Innocent | |
| 2001/0001234 A1 | 5/2001 | Addy et al. | |
| 2001/0012113 A1 | 8/2001 | Yoshizawa et al. | |
| 2001/0012127 A1 | 8/2001 | Fukuda et al. | |
| 2001/0015821 A1 | 8/2001 | Namizuka et al. | |
| 2001/0019429 A1 | 9/2001 | Oteki et al. | |
| 2001/0021278 A1 | 9/2001 | Fukuda et al. | |
| 2001/0033410 A1 | 10/2001 | Helsel et al. | |
| 2001/0050778 A1 | 12/2001 | Fukuda et al. | |
| 2001/0054126 A1 | 12/2001 | Fukuda et al. | |
| 2002/0012131 A1 | 1/2002 | Oteki et al. | |
| 2002/0015111 A1 | 2/2002 | Harada | |
| 2002/0018244 A1 | 2/2002 | Namizuka et al. | |
| 2002/0027670 A1 | 3/2002 | Takahashi et al. | |
| 2002/0033887 A1 | 3/2002 | Hieda et al. | |
| 2002/0041383 A1 | 4/2002 | Lewis, Jr. et al. | |
| 2002/0044778 A1 | 4/2002 | Suzuki | |
| 2002/0054374 A1 | 5/2002 | Inoue et al. | |
| 2002/0063802 A1 | 5/2002 | Gullichsen et al. | |
| 2002/0105579 A1 | 8/2002 | Levine et al. | |
| 2002/0126210 A1 | 9/2002 | Shinohara et al. | |
| 2002/0146136 A1 | 10/2002 | Carter, Jr. | |
| 2002/0149683 A1 | 10/2002 | Post | |
| 2002/0158971 A1 | 10/2002 | Daiku et al. | |
| 2002/0167202 A1 | 11/2002 | Pfalzgraf | |
| 2002/0167602 A1 | 11/2002 | Nguyen | |
| 2002/0169938 A1 | 11/2002 | Scott et al. | |
| 2002/0172199 A1 | 11/2002 | Scott et al. | |
| 2002/0191694 A1 | 12/2002 | Ohyama et al. | |
| 2002/0196470 A1 | 12/2002 | Kawamoto et al. | |
| 2003/0035100 A1 | 2/2003 | Dimsdale et al. | |
| 2003/0067461 A1 | 4/2003 | Fletcher et al. | |
| 2003/0122825 A1 | 7/2003 | Kawamoto | |
| 2003/0142222 A1 | 7/2003 | Hordley | |
| 2003/0146975 A1 | 8/2003 | Joung et al. | |
| 2003/0167420 A1 | 9/2003 | Parsons | |
| 2003/0169353 A1 | 9/2003 | Keshet et al. | |
| 2003/0169918 A1 | 9/2003 | Sogawa | |
| 2003/0197701 A1 | 10/2003 | Teodosiadis et al. | |
| 2003/0222995 A1 | 12/2003 | Kaplinsky et al. | |
| 2003/0223007 A1 | 12/2003 | Takane | |
| 2004/0001061 A1 | 1/2004 | Stollnitz et al. | |
| 2004/0001234 A1 | 1/2004 | Curry et al. | |
| 2004/0032516 A1 | 2/2004 | Kakarala | |
| 2004/0051716 A1 * | 3/2004 | Sevigny | 345/589 |
| 2004/0066970 A1 | 4/2004 | Matsugu | |
| 2004/0100588 A1 | 5/2004 | Hartson et al. | |
| 2004/0101313 A1 | 5/2004 | Akiyama | |
| 2004/0109069 A1 | 6/2004 | Kaplinsky et al. | |
| 2004/0151372 A1 | 8/2004 | Reshetov et al. | |
| 2004/0189875 A1 | 9/2004 | Zhai et al. | |

| | | | | |
|---|---|---|---|---|
| 2004/0207631 | A1 | 10/2004 | Fenney et al. | |
| 2004/0218071 | A1 | 11/2004 | Chauville et al. | |
| 2004/0247196 | A1 | 12/2004 | Chanas et al. | |
| 2005/0007378 | A1 | 1/2005 | Grove | |
| 2005/0007477 | A1 | 1/2005 | Ahiska | |
| 2005/0030395 | A1 | 2/2005 | Hattori | |
| 2005/0046704 | A1 | 3/2005 | Kinoshita | |
| 2005/0073591 | A1* | 4/2005 | Ishiga et al. | 348/223.1 |
| 2005/0099418 | A1 | 5/2005 | Cabral et al. | |
| 2005/0110790 | A1 | 5/2005 | D'Amora | |
| 2005/0185058 | A1 | 8/2005 | Sablak | |
| 2005/0238225 | A1 | 10/2005 | Jo et al. | |
| 2005/0243181 | A1 | 11/2005 | Castello et al. | |
| 2005/0248671 | A1 | 11/2005 | Schweng | |
| 2005/0261849 | A1 | 11/2005 | Kochi et al. | |
| 2005/0268067 | A1 | 12/2005 | Lee et al. | |
| 2005/0286097 | A1 | 12/2005 | Hung et al. | |
| 2006/0004984 | A1 | 1/2006 | Morris et al. | |
| 2006/0050158 | A1 | 3/2006 | Irie | |
| 2006/0061658 | A1 | 3/2006 | Faulkner et al. | |
| 2006/0087509 | A1 | 4/2006 | Ebert et al. | |
| 2006/0133697 | A1 | 6/2006 | Uvarov et al. | |
| 2006/0153441 | A1* | 7/2006 | Li | 382/162 |
| 2006/0176375 | A1 | 8/2006 | Hwang et al. | |
| 2006/0197664 | A1 | 9/2006 | Zhang et al. | |
| 2006/0259732 | A1 | 11/2006 | Traut et al. | |
| 2006/0259825 | A1 | 11/2006 | Cruickshank et al. | |
| 2006/0274171 | A1 | 12/2006 | Wang | |
| 2006/0290794 | A1 | 12/2006 | Bergman et al. | |
| 2006/0293089 | A1 | 12/2006 | Herberger et al. | |
| 2007/0073996 | A1 | 3/2007 | Kruger et al. | |
| 2007/0091188 | A1 | 4/2007 | Chen et al. | |
| 2007/0106874 | A1 | 5/2007 | Pan et al. | |
| 2007/0126756 | A1 | 6/2007 | Glasco et al. | |
| 2007/0147706 | A1 | 6/2007 | Sasaki et al. | |
| 2007/0157001 | A1 | 7/2007 | Ritzau | |
| 2007/0168634 | A1 | 7/2007 | Morishita et al. | |
| 2007/0168643 | A1 | 7/2007 | Hummel et al. | |
| 2007/0171288 | A1 | 7/2007 | Inoue et al. | |
| 2007/0236770 | A1 | 10/2007 | Doherty et al. | |
| 2007/0247532 | A1 | 10/2007 | Sasaki | |
| 2007/0262985 | A1* | 11/2007 | Watanabe et al. | 345/420 |
| 2007/0285530 | A1 | 12/2007 | Kim et al. | |
| 2008/0030587 | A1 | 2/2008 | Helbing | |
| 2008/0062164 | A1 | 3/2008 | Bassi et al. | |
| 2008/0101690 | A1 | 5/2008 | Hsu et al. | |
| 2008/0143844 | A1 | 6/2008 | Innocent | |
| 2008/0263284 | A1 | 10/2008 | da Silva et al. | |
| 2009/0010539 | A1 | 1/2009 | Guarnera et al. | |
| 2009/0041341 | A1* | 2/2009 | Scheibe | 382/162 |
| 2009/0116750 | A1 | 5/2009 | Lee et al. | |
| 2009/0160957 | A1 | 6/2009 | Deng et al. | |
| 2009/0257677 | A1 | 10/2009 | Cabral et al. | |
| 2009/0297022 | A1* | 12/2009 | Pettigrew et al. | 382/162 |
| 2010/0266201 | A1 | 10/2010 | Cabral et al. | |

FOREIGN PATENT DOCUMENTS

| | | | |
|---|---|---|---|
| EP | 1447977 | | 8/2004 |
| EP | 1550980 | | 7/2005 |
| GB | 2045026 | | 10/1980 |
| GB | 2363018 | | 5/2001 |
| JP | 61187467 | | 8/1986 |
| JP | 62151978 | | 7/1987 |
| JP | 07015631 | | 1/1995 |
| JP | 8036640 | | 2/1996 |
| JP | 08079622 | | 3/1996 |
| JP | 09233353 | A2 | 9/1997 |
| JP | 2001052194 | | 2/2001 |
| JP | 2002207242 | | 7/2002 |
| JP | 2003085542 | | 3/2003 |
| JP | 2004221838 | | 8/2004 |
| JP | 2005094048 | | 4/2005 |
| JP | 2005182785 | | 7/2005 |
| JP | 2005520442 | | 7/2005 |
| JP | 2006086822 | | 3/2006 |
| JP | 2006094494 | | 4/2006 |
| JP | 2006121612 | | 5/2006 |
| JP | 2006134157 | | 5/2006 |
| JP | 20060203841 | A | 8/2006 |
| JP | 2007019959 | | 1/2007 |
| JP | 2007148500 | | 6/2007 |
| JP | 2007233833 | | 9/2007 |
| JP | 2007282158 | | 10/2007 |
| JP | 2008085388 | | 4/2008 |
| JP | 2008277926 | | 11/2008 |
| JP | 2009021962 | | 1/2009 |
| KR | 1020040043156 | | 5/2004 |
| KR | 1020060068497 | | 6/2006 |
| KR | 1020070004202 | | 1/2007 |
| WO | 03043308 | | 5/2003 |
| WO | 2004063989 | | 7/2004 |
| WO | 2007093864 | | 8/2007 |

OTHER PUBLICATIONS

M. Halstead, M. Kass, T. DeRose; "efficient, fair interolation using catmull-clark surfaces"; Sep. 1993; Computer Graphics and Interactive Techniques, Proc; pp. 35-44.

Morimoto et al., "Fast Electronic Digital Image Stabilization for Off-Road Navigation", Computer Vision Laboratory, Center for Automated Research University of Maryland, Real-Time Imaging, vol. 2, pp. 285-296, 1996.

Paik et al., "An Adaptive Motion Decision system for Digital Image Stabilizer Based on Edge Pattern Matching", IEEE Transactions on Consumer Electronics, vol. 38, No. 3, pp. 607-616, Aug. 1992.

Parhami, Computer Arithmetic, Oxford University Press, Jun. 2000, pp. 413-418.

S. Erturk, "Digital Image Stabilization with Sub-Image Phase Correlation Based Global Motion Estimation", IEEE Transactions on Consumer Electronics, vol. 49, No. 4, pp. 1320-1325, Nov. 2003.

S. Erturk, "Real-Time Digital Image Stabilization Using Kalman Filters", http://www.ideallibrary.com, Real-Time Imaging 8, pp. 317-328, 2002.

T. DeRose, M., Kass, T. Troung; "subdivision surfaces in character animation"; Jul. 1998; Computer Graphics and Interactive Techniques, Proc; pp. 85-94.

Takeuchi, S., Kanai, T., Suzuki, H., Shimada, K., Kimura, F., Subdivision surface fitting with QEM-basd mesh simplificatio and reconstruction of aproximated B-Spline surfaces, 200, Eighth Pacific Conference on computer graphics and applications pp. 202-2012.

Uomori et al., "Automatic Image Stabilizing System by Full-Digital Signal Processing", vol. 36, No. 3, pp. 510-519, Aug. 1990.

Uomori et al., "Electronic Image Stabiliztion System for Video Cameras and VCRS", J. Soc. Motion Pict. Telev. Eng., vol. 101, pp. 66-75, 1992.

Chaudhuri, "The impact of NACKs in shared memory scientific applications", Feb. 2004, IEEE, IEEE Transactions on Parallel and distributed systems vol. 15, No. 2, p. 134-150.

Laibinis, "Formal Development of Reactive Fault Tolerant Systems", Sep. 9, 2005, Springer, Second International Workshop, RISE 2005, p. 234-249.

Wikipedia, Memory Address, Oct. 29, 2010, pp. 1-4, www.wikipedia.com.

Wikipedia, Physical Address, Apr. 17, 2010, pp. 1-2, www.wikipedia.com.

"A Pipelined Architecture for Real-Time orrection of Barrel Distortion in Wide-Angle Camera Images", Hau, T. Ngo, Student Member, IEEE and Vijayan K. Asari, Senior Member IEEE, IEEE Transaction on Circuits and Sytstems for Video Technology: vol. 15 No. 3 Mar. 2005 pp. 436-444.

"Calibration and removal of lateral chromatic abberation in images" Mallon, et al. Science Direct Copyright 2006; 11 pages.

"Method of Color Interpolation in a Singe Sensor Color Camera Using Green Channel Seperation" Weerasighe, et al Visual Information Processing Lab, Motorola Austrailian Research Center pp. IV-3233-IV3236, 2002.

D. Doo, M. Sabin "Behaviour of recrusive division surfaces near extraordinary points"; Sep. 197; Computer Aided Design; vol. 10, pp. 356-360.

D.W.H. Doo; "A subdivision algorithm for smoothing down irregular shaped polyhedrons"; 1978; Interactive Techniques in Computer Aided Design; pp. 157-165.

Davis, J., Marschner, S., Garr, M., Levoy, M., Filling holes in complex surfaces using volumetric diffusion, Dec. 2001, Stanford University, pp. 1-9.
Donald D. Spencer, "Illustrated Computer Graphics Dictionary", 1993, Camelot Publishing Company, p. 272.
Duca et al., "A Relational Debugging Engine for Graphics Pipeline, International Conference on Computer Graphics and Interactive Techniques", ACM SIGGRAPH Jul. 2005, pp. 453-463.
E. Catmull, J. Clark, "recursively enerated B-Spline surfaces on arbitrary topological meshes"; Nov. 1978; Computer aided design; vol. 10; pp. 350-355.
gDEBugger, graphicRemedy, http://www.gremedy.com, Aug. 8, 2006, pp. 1-18.
http://en.wikipedia.org/wiki/Bayer_filter; "Bayer Filter"; Wikipedia, the free encyclopedia; pp. 1-4.
http://en.wikipedia.org/wiki/Color_filter_array; "Color Filter Array"; Wikipedia, the free encyclopedia; pp. 1-5.
http://en.wikipedia.org/wiki/Color_space; "Color Space"; Wikipedia, the free encyclopedia; pp. 1-4.
http://en.wikipedia.org/wiki/Color_translation; "Color Management"; Wikipedia, the free encyclopedia; pp. 1-4.
http://en.wikipedia.org/wiki/Demosaicing; "Demosaicing"; Wikipedia, the free encyclopedia; pp. 1-5.
http://en.wikipedia.org/wiki/Half_tone; "Halftone"; Wikipedia, the free encyclopedia; pp. 1-5.
http://en.wikipedia.org/wiki/L*a*b*; "Lab Color Space"; Wikipedia, the free encyclopedia; pp. 1-4.
http://Slashdot.org/articles/07/09/06/1431217.html.
http:englishrussia.com/?p=1377.
J. Bolz, P. P Schroder; "rapid evaluation of catmull-clark subdivision surfaces"; Web 3D '02.
J. Stam; "Exact Evaluation of Catmull-clark subdivision surfaces at arbitrary parameter values"; Jul. 1998; Computer Graphics; vol. 32; pp. 395-404.
Keith R. Slavin; Application As Filed entitled "Efficient Method for Reducing Noise and Blur in a Composite Still Image From a Rolling Shutter Camera"; Application No. 12069669; Filed Feb. 11, 2008.
Ko et al., "Fast Digital Image Stabilizer Based on Gray-Coded Bit-Plane Matching", IEEE Transactions on Consumer Electronics, vol. 45, No. 3, pp. 598-603, Aug. 1999.
Ko, et al., "Digital Image Stabilizing Algorithms Basd on Bit-Plane Matching", IEEE Transactions on Consumer Electronics, vol. 44, No. 3, pp. 617-622, Aug. 1988.
Krus, M., Bourdot, P., Osorio, A., Guisnel, F., Thibault, G., Adaptive tessellation of connected primitives for interactive walkthroughs in complex industrial virtual environments, Jun. 1999, Proceedings of the Eurographics workshop, pp. 1-10.
Kumar, S., Manocha, D., Interactive display of large scale trimmed NURBS models, 1994, University of North Carolina at Chapel Hill, Technical Report, p. 1-36.
Kuno et al. "New Interpolation Method Using Discriminated Color Correlation for Digital Still Cameras" IEEE Transac. On Consumer Electronics, vol. 45, No. 1, Feb. 1999, pp. 259-267.

* cited by examiner

Exemplary Color
Enhancement Color Space 100

Exemplary Color
Enhancement Color Space 200

Exemplary Color
Enhancement Color Space 300

Exemplary Color
Enhancement Color Space 400

Exemplary Process 500

Exemplary Process 600

Exemplary Process 700

Exemplary Process 800

Exemplary Computer
System 900

METHOD AND SYSTEM FOR COLOR ENHANCEMENT WITH COLOR VOLUME ADJUSTMENT AND VARIABLE SHIFT ALONG LUMINANCE AXIS

BACKGROUND

Color enhancement is a known art in the field of consumer electronics to enhance the appearance of an image (still or video) to look more vibrant by artificially shifting the colors corresponding to real-life objects towards what the human eye and the human persona commonly associate with beauty. For example, a field of grass or a piece of foliage naturally appearing as pale green may be artificially shifted to a more saturated green to make the field or foliage appear fresher and more verdant. A pale blue sky may be artificially shifted towards a more saturated blue to make the sky appear more vibrant and clear. Similarly, pallid human skin may be artificially shifted to a more reddish brown, causing the human skin appear to have a healthier complexion. Accordingly, circuitry has been developed to detect programmable regions of blue, green, and skin and to perform a programmable shift when the regions are detected.

Blue, green and skin enhancements are the usual color enhancements performed in the industry. In conventional techniques, images may be encoded as a plurality of pixels, each pixel having a color. In order to perform the color enhancement of an image, the colors of the pixels comprising the image must be detected. Specifically, a determination must be made whether a given pixel in the image has the color of interest (e.g., blue, green and "skin color"). After a pixel having a color of interest is detected, the color value of that pixel is multiplied and/or shifted by a certain amount.

The detection and the shift are usually performed in the YCbCr color space. A YCbCr space is a 3 dimensional space where Y is the monochrome component pertaining to the brightness or luminance of the image, and the Cb-Cr plane corresponds to the color components of the image for a particular value of luminance. Typically, the Cb-Cr color plane comprises a vertical axis (Cr) and a horizontal axis (Cb). For many luminance values, the color green can be largely detected if the value of a pixel's color component falls in the $3^{rd}$ quadrant (Cb<0, Cr<0). Similarly, the color blue is largely detected in the $4^{th}$ quadrant (Cb>0, Cr<0). Likewise, skin color is usually detected somewhere in the second quadrant (Cb<0, Cr>0).

According to conventional methods, a region (typically a triangle for green or blue, and a trapezoid for skin) is defined in a Cb-Cr color plane as a region of interest, and a second, corresponding region (of the same shape as the region of interest) is defined in the same Cb-Cr color plane as the shift region. Any pixel which is detected in the region of interest is thus shifted to a corresponding position in the shift region. As regions of interest and shift regions may overlap in some portions, a pixel may be shifted to be in another position in the region of interest. Shifts may be executed as a vector shift, such that every position in a region of interest is shifted in the magnitude and direction by the same vector.

The programmable parameters for blue and green enhancement typically include: (i) the regions of interest (e.g., "detection regions") based on the side lengths of the triangle and the offset from the origin (O), and (ii) the shift out vector towards more lively green or blue. For skin, the detection is based on parameters such as the shift from the origin, the length of the sides of the trapezoid, and the angle of location with respect to the vertical (Cr) axis. Enhancement for skin is a vector that either specifies an inward squeeze of that trapezoidal area (e.g., to make it conform to a narrower range of widely preferred skin hue) or a shift towards red (e.g., to make the skin more livid).

For a given set of values for the parameters, conventional methods of detection and shift are performed independently of Y (luminance). In other words, the detection region and the accompanying shift region will not vary along the luminance axis. Specifically, the same detection region and corresponding shift region (according to the same shift vector) will appear in the same relative positions in each Cb-Cr plane for each Y along the luminance axis. However, the positions of colors on the Cb-Cr planes vary along the luminance axis. For example, along the luminance axis, a color region does not always remain restricted to a fixed point, or even a fixed quadrant. Also, the shape of the color region of interest (to be enhanced) grows and shrinks along the luminance axis, and different colors are distributed dissimilarly in Cb-Cr planes along the luminance axis Therefore, a color shade that occupies a certain region of the Cb-Cr plane for one value of luminance on the luminance axis may occupy a different region in the Cb-Cr plane at a different luminance value on the luminance axis. The color intensity also changes along the luminance axis, so that a color (e.g., green) which moves from dark (green) to light (green) along the luminance axis occupies varying regions on the Cb-Cr plane for varying luminance values, e.g., as one moves along the luminance axis Accordingly, a region of interest which includes the position of a color in a Cb-Cr plane for one luminance may not include the position of the same color in a Cb-Cr plane for another luminance. Thus, a detection region for one luminance that would detect a color and perform a shift for pixels pertaining to one color may not detect the color for another value of the luminance. Conversely, an unintended shift may be performed for a color which was outside the detection region for the original value of luminance, but whose position now lies within the detection region in the new value of luminance.

Furthermore, conventional methods are often restricted by several limitations which adversely affect their efficacy. For example, current methods for color enhancement are restricted to blue, green and skin enhancement. Color enhancement for other colors (e.g., red) is not available through conventional color enhancement techniques. Moreover, the shape of the detection regions and corresponding shift regions are typically invariable, and/or may also be invariable in size along the Y (luminance) axis. These limitations further exacerbate the issue of having undetected enhancement candidates and improper enhancements.

SUMMARY

Embodiments of the present invention are directed to provide a method and system for enhancing the display of color input in graphical display devices, such as image display devices and video display devices, etc. . . . A method is provided which allows for the construction of a variable detection volume and a variable shift volume along a luminance axis in a three dimensional color space. Color detection and color shifts therefore vary by luminance advantageously.

One novel method enables a re-positioning of detection regions comprised in the detection volume to account for shifts of a color region. Another novel method provides the ability to adjust the size and orientation of a detection region and corresponding shift region. Yet another novel method allows for the selection and usage of an assortment of shapes for more flexible and precise detection and shift schemes.

Each of the above novel methods provide parameters that vary depending on the luminance of the image, thereby providing advantageous color enhancement in the resultant display. In short, color enhancement is more accurately specified based on the brightness of the color.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Figure 1:
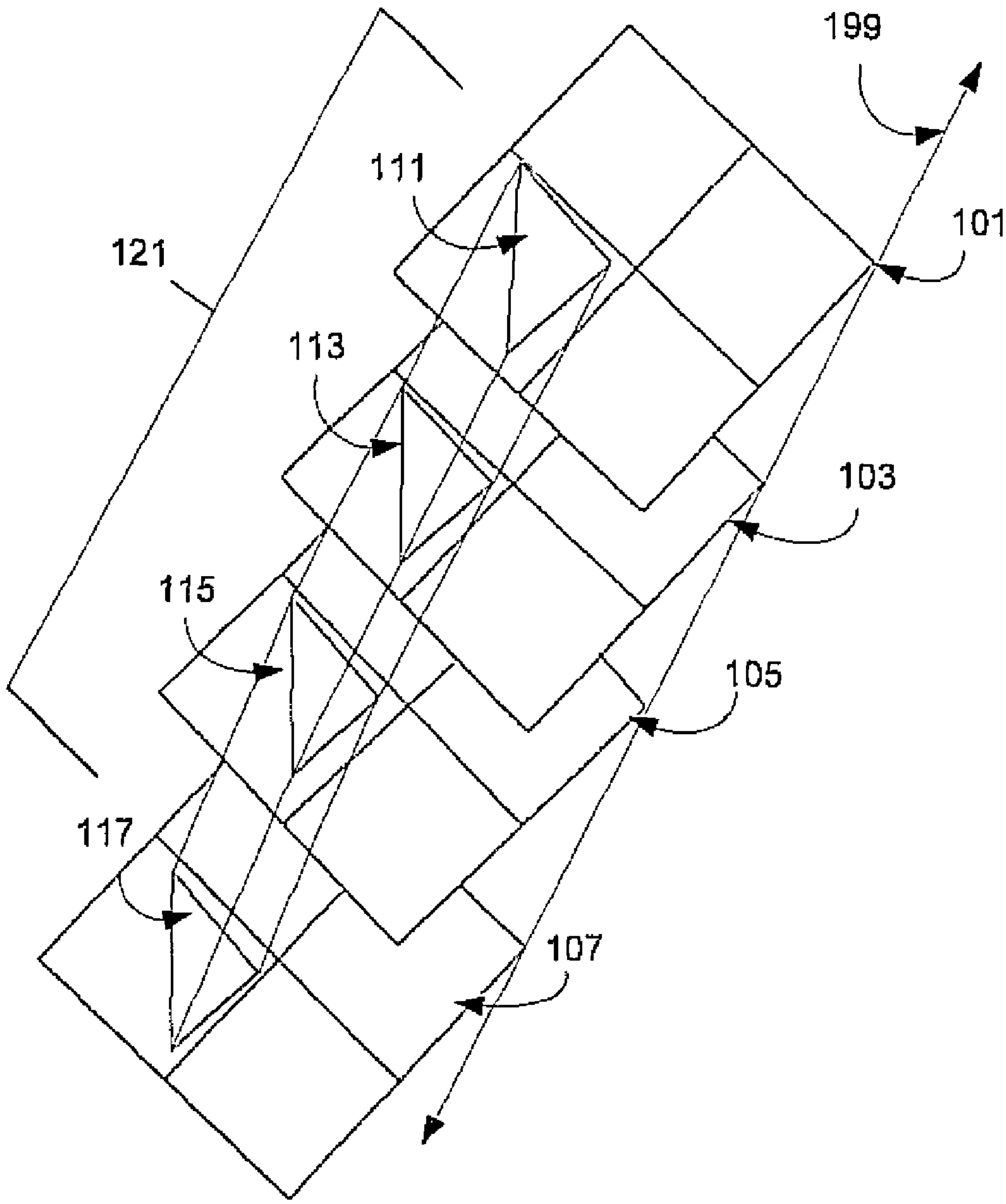
FIG. 1 depicts a graphical representation of an exemplary color enhancement color space comprising an exemplary detection volume along a luminance axis, in accordance with embodiments of the present invention.

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known processes, procedures, components, and circuits have not been described in detail as not to unnecessarily obscure aspects and features of the subject matter.

Portions of the detailed description that follow are presented and discussed in terms of a process. Although steps and sequencing thereof are disclosed in a figure herein (e.g., FIG. 6-9) describing the operations of this process, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "traversing," "associating," "identifying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

While the following exemplary configurations are shown as incorporating specific, enumerated features and elements, it is understood that such depiction is exemplary. Accordingly, embodiments are well suited to applications involving different, additional, or fewer elements, features, or arrangements.

Exemplary Color Enhancement Color Space

With reference now to FIG. 1, a graphical representation of an exemplary color enhancement color space 100 comprising an exemplary detection volume 121 along a luminance axis 199 is depicted, in accordance with one embodiment. In a typical arrangement, color enhancement color space 100 is a three dimensional color space that includes a luminance axis 199, and a plurality of color coordinate planes, in Cb-Cr, for instance, (e.g., color coordinate planes 101, 103, 105, and 107), each of which corresponds to a specific luminance of the luminance axis 199. In one embodiment, the luminance axis 199 comprises a range of luminance values from 0 to 255. As shown, color coordinate planes 101, 103, 105 and 107 comprise a subset of color coordinate planes corresponding to four exemplary luminance values in the luminance axis 199.

In one embodiment, color enhancement color space 100 is an implementation of a component in a color image pipeline. Color enhancement color space 100 may be, for example, one of the components commonly used between an image source (e.g., a camera, scanner, or the rendering engine in a computer game), and an image renderer (e.g., a television set, computer screen, computer printer or cinema screen), for performing any intermediate digital image processing consisting of two or more separate processing blocks. An image/video pipeline may be implemented as computer software, in a digital signal processor, on a field-programmable gate array (FPGA) or as a fixed-function application-specific integrated circuit (ASIC). In addition, analog circuits can be used to perform many of the same functions.

In one embodiment, a color coordinate plane may comprise, for example, a Cb-Cr color space for encoding color information. In a typical embodiment, a color space comprises a plurality of discrete positions in a coordinate plane 101, 103, 105 and 107, each position, when coupled to the associated luminance value, corresponding to a specific color In further embodiments, each of the color coordinate planes 101, 103, 105 and 107 includes at least one detection region (e.g., detection regions 111, 113, 115, 117). Each detection region 111, 113, 115 and 117 comprises a bounded area of a color coordinate plane 101, 103, 105 and 107 comprising a plurality of positions in the color coordinate plane 101, 103, 105 and 107.

In one embodiment, each detection region 111, 113, 115 and 117 further corresponds to one or more shades in a family of colors for which color enhancement is desired. In another embodiment, a detection region may be separately defined for each color coordinate plane 101, 103, 105 and 107 along the luminance axis 199 throughout the detection volume 121 for each of the families of colors (e.g., red, blue, yellow and green). In still further embodiments, a detection region may be separately defined for each color coordinate plane 101, 103, 105 and 107 along the luminance axis 199 throughout the detection volume 121 comprising a combination of different colors (e.g., a mixture of variable amounts of red, blue, green and yellow).

Figure 2:
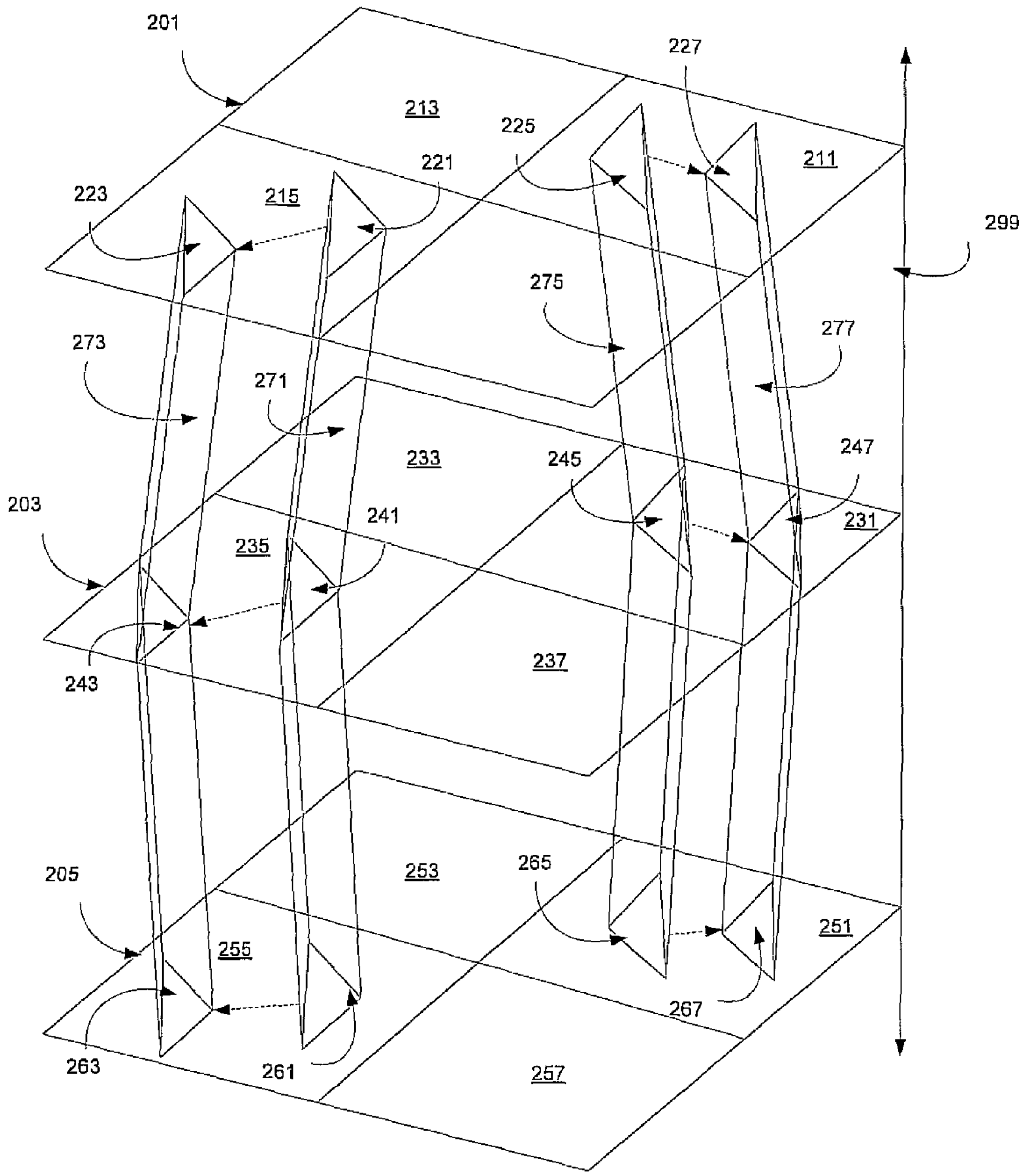
FIG. 2 depicts a graphical representation of an exemplary color enhancement color space comprising an exemplary detection volume and a corresponding exemplary shift volume that vary along a luminance axis, in accordance with embodiments of the present invention.

As depicted in FIG. 1 and FIG. 2, the detection regions are presented in the shape of a triangle, however, the choice of shape may be arbitrary and selected (e.g., from a palette of shapes) according to preference or usage. Other shape choices may include, for example, quadrilaterals, ellipses, pentagons, etc).

In a further embodiment, the combination of detection regions 111, 113, 115 and 117 along the luminance axis 199 forms a detection volume 121. In one embodiment, each detection region 111, 113, 115 and 117 may be independently defined based on its luminance. In alternate embodiments, a detection volume 121 may be linearly interpolated from two or more defined detection regions 111, 113, 115 and 117. For example, a detection region defined in one color coordinate plane may be linearly coupled to the detection region defined in another color coordinate plane in the detection volume 121 having an alternate luminance value. The line segments extending from each vertex and traversing the three dimensional color space between the defined color coordinate planes thus bound the detection regions for the color coordinate planes corresponding to the luminance values between the luminance values of the defined detection regions. In alternate embodiments, when more than two detection regions are defined, interpolation may be performed between each of detection region and the most proximate defined detection regions corresponding to luminance values (both greater or less than) along the luminance axis 199. In still further embodiments, interpolation may be avoided by defining as many planes on the luminance axis as there are possible luminance values, e.g., 256 planes in a system with an 8-bit luminance value.

In still further embodiments, input (e.g., a pixel) received is compared to the detection volume 121. If the color of the pixel corresponds to a position within a detection region 111, 113, 115 and 117 of a color coordinate plane 101, 103, 105 and 107 for the pixel's luminance value, the pixel becomes a candidate for color enhancement, e.g., shifting within its color coordinate plane by some defined amount.

With reference to FIG. 2, a graphical representation of an exemplary color enhancement color space 200 comprising a plurality of exemplary detection volumes 271, 275 and a corresponding plurality of exemplary shift volumes 273, 277 along a luminance axis 299 is depicted, in accordance with various embodiments. The detection volumes have a luminance component and therefore provide color detection that varies by luminance. In a typical arrangement, color enhancement color space 200 is a three dimensional color space that includes a luminance axis 299, and a plurality of color coordinate planes (e.g., color coordinate planes 201, 203, and 205), each of which correspond to a specific luminance of the luminance axis 299.

In one embodiment, each color coordinate plane of the plurality of color coordinate planes 201, 203, and 205 is a two dimensional plane comprising four quadrants, designated according to a typical Cartesian coordinate system, and separated by two intersecting axes. In one embodiment, each set of quadrants in a color coordinate plane corresponds to the color quadrants of a Cb-Cr color plane. As depicted in FIG. 2, quadrant 211 is a first quadrant in color coordinate plane 201. Likewise, quadrant 231 and 251 comprise the first quadrants in color coordinate planes 203 and 205, respectively. Quadrants 213, 233 and 253 comprise the second quadrants, quadrants 215, 235 and 255 comprise the third quadrants, and quadrants 217, 237 and 257 comprise the fourth and last quadrants in color coordinate planes 201, 203 and 205, respectively.

As presented, color enhancement space 200 includes a plurality of detection volumes. Color enhancement space 200 comprises detection volume 271, with detection regions (e.g., 221, 241, 261) disposed in the third quadrant of the plurality of color coordinate planes 201, 203 and 205 in color enhancement space 200; and detection volume 275, with detection regions (e.g., 225, 245, 265) disposed in the first quadrant of the plurality of color coordinate planes 201, 203 and 205. Each detection volume may, for example, correspond to a specific color or a group of related colors (e.g., shades or hues within the same family of color) for which enhancement is desired (e.g., green, blue, red, etc).

As presented, each detection volume 271, 275 is comprised of a plurality of detection regions (e.g., detection regions 221, 225, 241, 245, 261 and 265), disposed in color coordinate planes 201, 203 and 205, respectively, and corresponding to the luminance value of the appropriate color coordinate plane 201, 203 and 205. Each detection volume 271, 275 also has a corresponding shift volume 273, 277 comprising a plurality of shift regions (e.g., shift regions 223, 227, 243, 247, 263 and 267). In one embodiment, the relative position of a detection region may vary by luminance. Furthermore, each detection region comprised in a detection volume 271, 273 further corresponds to a shift region in the same color coordinate plane, 201, 203 and 205, for the same luminance value. In further embodiments, each of the plurality of positions bounded by a detection region 221, 225, 241, 245, 261 and 265 has a corresponding position in the associated shift region 223, 227, 243, 247, 263 and 267, respectively. For example, each position in detection 221 may be pre-mapped to an alternate position in color coordinate plane 201 comprised in shift region 223, and may thus provide, in some embodiments, for shift variance by luminance.

In one embodiment, input (such as a pixel) comprising a luminance value and a chromatic value is translated into a coordinate position in a color coordinate plane. The resultant position is compared to a detection volume 271, 275 in color enhancement space 200. If the position and luminance value correspond to a position in the detection volume, the coordinate position of the pixel may be shifted to a pre-mapped position in the shift region corresponding to the specific detection region having the luminance value of the input. For example, a position detected in detection volume 271 may be shifted to a corresponding, pre-mapped position in shift volume 273 based on luminance. An exemplary shift is indicated by the dotted directed line segments, indicating a vector shift from a detection region to the corresponding shift region (e.g., 241 to 243). Likewise, a position detected in detection volume 275 may be shifted to a corresponding, pre-mapped position in shift volume 277. In alternate embodiments, a color enhancement color space 200 may include additional detection volumes and corresponding shift volumes corresponding to separate colors.

While detection regions 221, 225, 241, 245, 261 and 265 and corresponding shift regions 223, 227, 243, 247, 263 and 267 have been presented as being disposed entirely in one quadrant, such depiction is exemplary. Accordingly, embodiments are well suited to include a detection region and/or shift region each occupying portions of a plurality of quadrants.

Figure 3:
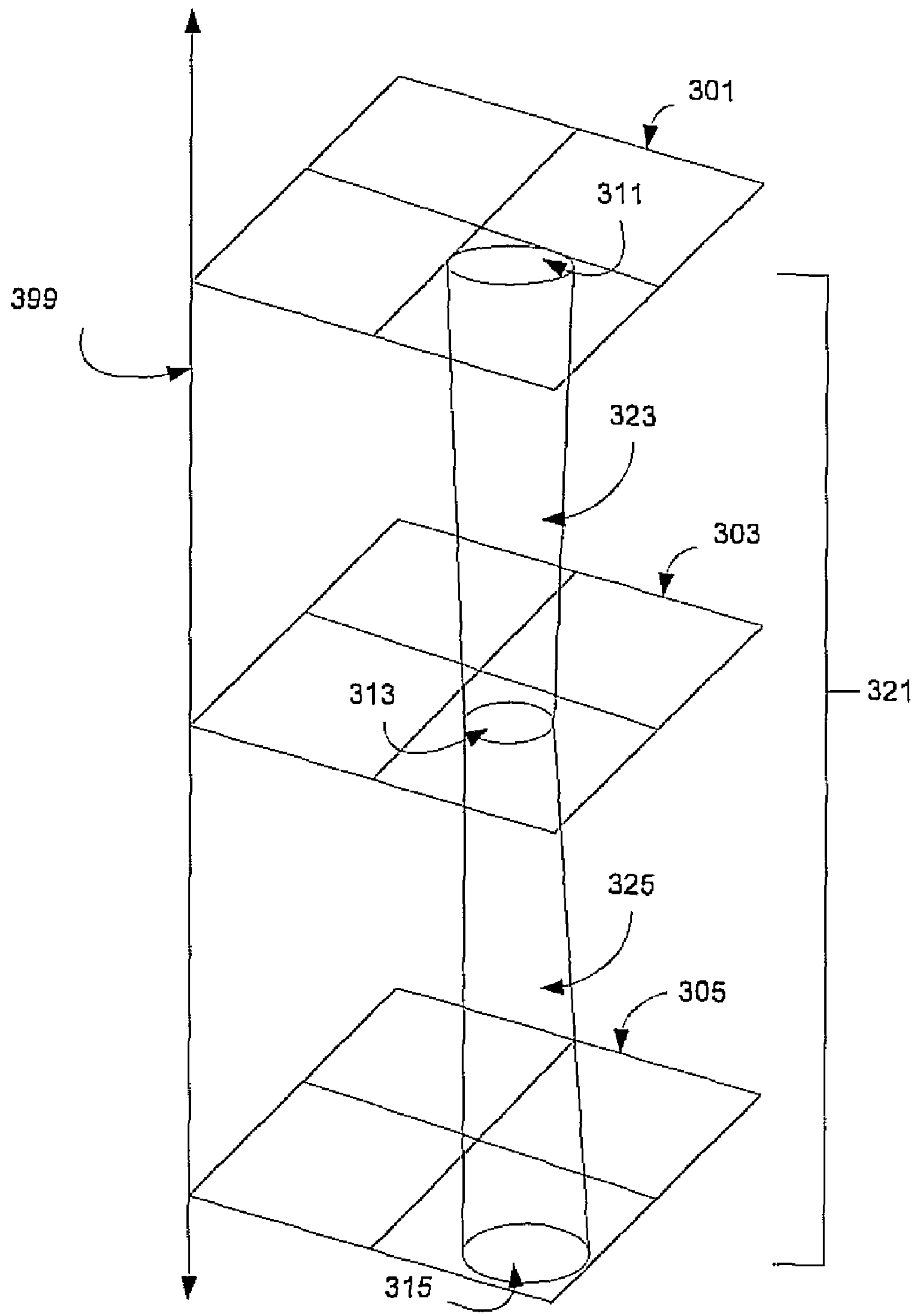
FIG. 3 depicts a graphical representation of an exemplary color enhancement color space comprising an alternate exemplary detection volume that varies along a luminance axis, in accordance with embodiments of the present invention.
Figure 4:
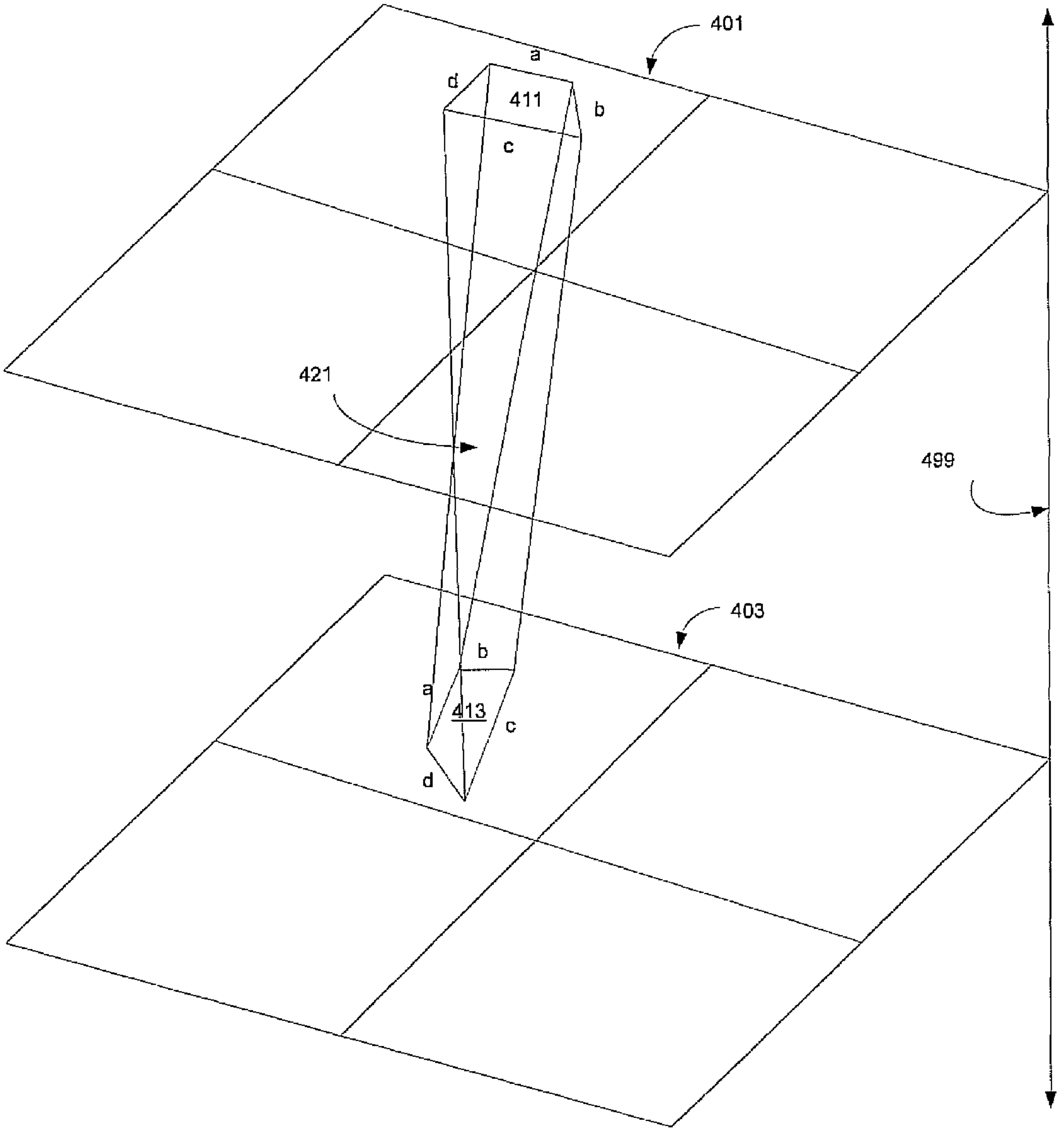
FIG. 4 a graphical representation of an exemplary a color enhancement color space comprising a detection volume exhibiting torsion variance along a luminance axis, in accordance with embodiments of the present invention.

With reference now to FIG. 3, a graphical representation of an exemplary color enhancement color space 300 comprising an alternate exemplary detection volume 321 along a luminance axis 399 is depicted, in accordance with one embodiment. In a typical arrangement, color enhancement color space 300 is a three dimensional color space that includes a luminance axis 399, and a plurality of color coordinate planes (e.g., color coordinate planes 301, 303 and 305), each of which corresponds to a specific luminance of the luminance axis 399. As shown, color coordinate planes 301, 303 and 305 comprise a subset of color coordinate planes corresponding to three exemplary luminance values in the luminance axis 399. Each color coordinate plane may include one or more detection regions (e.g., detection regions 311, 313, and 315), which, when combined, form a detection volume 321. As depicted in FIG. 3 and FIG. 4, the detection regions are presented having an elliptical shape, whose size, position and orientation may vary by luminance. However, other shapes may be suitable, according to preference or usage.

According to one embodiment, the combination of detection regions 311, 313, and 315 along the luminance axis 399 forms a detection volume 321. In one embodiment, each detection region 311, 313, and 315 may be independently defined, based on luminance. In alternate embodiments, a detection volume 321 may be linearly interpolated from two or more defined detection regions 311, 313, and 315. For example, a detection region defined in one color coordinate plane may be linearly coupled to the detection region defined in another color coordinate plane having an alternate luminance value. The line segments extending from each point on the circumference (or bounding edge for detection regions of other geometric shapes) and traversing the three dimensional color space between the defined color coordinate planes thus form the circumference (or boundaries) of the detection regions for the color coordinate planes corresponding to the luminance values between the luminance values of the defined detection regions.

In alternate embodiments, when more than two detection regions are defined, interpolation may be performed between each of detection region and proximate defined detection regions corresponding to luminance values (both greater and less than) along the luminance axis 399. For example, with reference to FIG. 3, a detection volume 321 may be composed from two sub-detection volumes 323, 325. Each sub-detection volume being interpolated from two defined detection regions. Specifically, sub-detection volume 323 is interpolated from detection region 311 and 313, whereas sub-detection volume 325 is interpolated from detection region 313 and 315.

In one embodiment, each detection region 311, 313 and 315 may be variable along the luminance axis 399. A detection region 311, 313 and 315 may be variable by, for example, the size of a detection region and/or shift region for different coordinate planes along the luminance axis. For example, the colors comprised in a detection region (e.g., detection region 311) of one color coordinate plane (e.g., color coordinate plane 301) for one luminance value may have a different position in a color coordinate plane (e.g., color coordinate plane 303, 305) of a different luminance value. Accordingly, to effectively "capture" the same colors during detection for color enhancement may require a re-positioning (or other like adjustment) of the detection regions for other luminance values. Accordingly, in one embodiment, a detection region 311, 313, and 315 may have a position, relative to the origin in the color coordinate plane 301, 303 and 305, which is different for one or more other luminance values in the three dimensional color space 300.

In further embodiments, the size of a detection region 311, 313 and 315 may also vary within the plurality of color coordinate planes 301, 303 and 305 based on the luminance value along the luminance axis 399. As depicted, detection region 313 comprises an area less than that of detection region 311 and 315. Consequently, detection volume 321 exhibits an interpolation consistent with the variance in size. In still further embodiments, the position and size of the shift regions comprising a shift volume (not shown) corresponding to said detection regions 311, 313 and 315 may also vary in size and position with respect to other shift regions in the shift volume along the luminance axis 399. In yet further embodiments, the position and size of the shift regions comprising a shift volume corresponding to said detection regions 311, 313 and 315 may also vary in size and position relative to the respective corresponding detection regions 311, 313 and 315 along the luminance axis 399.

With reference now to FIG. 4, a graphical representation of an exemplary color enhancement color space 400 comprising a detection volume 421 exhibiting variance attributable to torsion along a luminance axis 499 is depicted, in accordance with one embodiment. In a typical arrangement, color enhancement color space 400 is a three dimensional color space that includes a luminance axis 499, a plurality of color coordinate planes (e.g., color coordinate planes 411, 413), each of which corresponds to a specific luminance of the luminance axis 499. As shown, color coordinate planes 401, 403 comprise a subset of color coordinate planes corresponding to two exemplary luminance values in the luminance axis 499. Each color coordinate plane 401, 403 may include one or more detection regions (e.g., detection regions 411, 413), which, when combined, form a detection volume 421. As depicted in FIG. 4, the detection regions may assume a trapezoidal shape.

In some embodiments, the orientation of a detection region 411, 413 may vary within the plurality of color coordinate planes 401, 403 along the luminance axis 499. For example, a detection region (e.g., detection region 413) may be rotated about a separate axis relative to another detection region (e.g., detection region 411) for the same color or group of colors for a plurality of color coordinate planes 401, 403 along the luminance axis 499. As depicted, detection region 411 comprises a trapezoid having four sides, enumerated a, b, c, and d. Detection region 413 depicts an exemplary rotation with corresponding sides. Consequently, detection volume 421, when interpolated from detection region 411 and 413, exhibits a torsion consistent with the variance in orientation. In further embodiments, the rotation of a detection region relative to another detection region for the same color or group may accompany a re-location and/or adjustment to the area of the detection region.

Exemplary Color Enhancement Process

Figure 5:
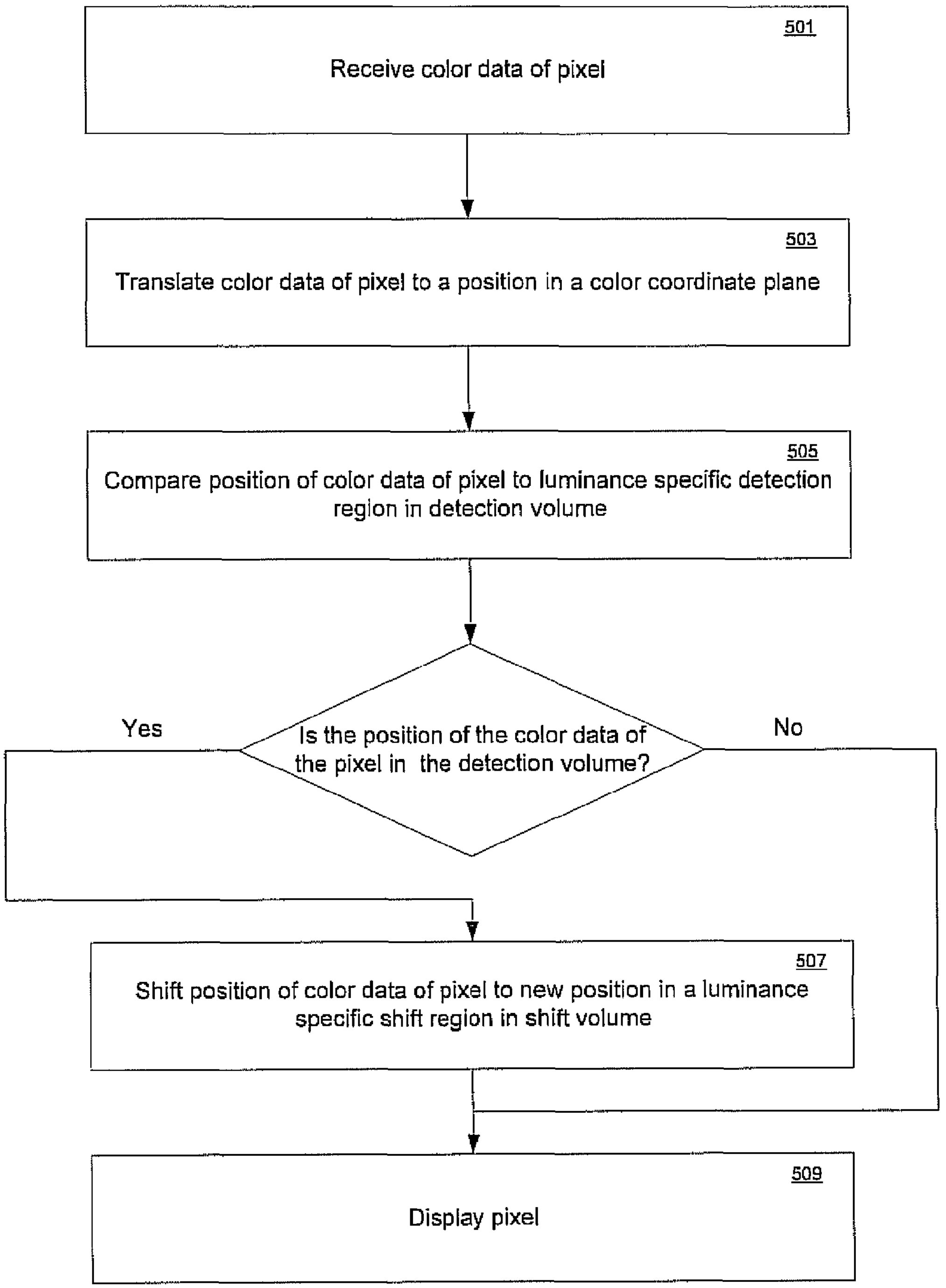
FIG. 5 depicts a flowchart of an exemplary process for enhancing pixel color information in a display, in accordance with embodiments of the present invention.

With reference to FIG. 5, a flowchart of an exemplary computer implemented process 500 for enhancing pixel color information in a display is depicted, in accordance with various embodiments. Steps 501-509 describe exemplary steps comprising the process 500 in accordance with the various embodiments herein described. Process 500 may be performed in, for example, a component in a color-image pipeline of an electronic device. In one embodiment, process 500 may be implemented as a series of computer-executable instructions.

At step 501, color data is received for one or more pixels. The pixels may comprise, for example, the pixels of an image frame or still frame of a video. In one embodiment, the color data for each pixel includes the luminance value of the pixel, and a set of chromatic values. In further embodiments, the color space is a Cb-Cr color space.

At step 503, the set of chromatic values comprising the color data received in step 501 is translated into coordinates representing the color of the pixel as a first position in a color coordinate plane having the luminance received as input in a color space.

At step 505, the color data for the pixels received in step 501 and translated in step 503 is compared to a detection volume. Comparing the color data for the pixels received in step 501 may comprise, for example, determining the luminance-specific detection region in a detection volume and comparing the position of the pixel within the luminance-specific detection region. A color is "detected" if the position of the pixel's color (e.g., the first position) lies within the area bounded by the luminance-specific detection region corresponding to the luminance value of the pixel. In one embodiment, each pixel of the plurality of pixels may be compared to the luminance specific detection region in the detection volume corresponding to the luminance of the pixel. A pixel having an undetected color (e.g., a pixel having a position in the color space outside the detection volume) is unmodified and may be displayed without alteration. A pixel whose color data corresponds to a position in the color space within the detection volume proceeds to step 507.

In one embodiment, the detection volume is constructed along a luminance axis for a three dimensional color space. A detection volume may be constructed by, for example, independently defining a specific detection region comprising the detection volume for each luminance value in the luminance axis in the three dimensional color space. Alternatively, a detection volume may be interpolated from two or more luminance-specific detection regions defined for two or more luminance values in the luminance axis. For example, a detection volume may be interpolated from a first defined detection region in a first luminance-specific color coordinate plane corresponding to a first luminance value and a second defined detection region in a second luminance-specific color coordinate plane corresponding to a second luminance value. The plurality of points along the perimeter of the first detection region in the first luminance-specific color coordinate plane may be linearly coupled to corresponding points along the perimeter of a second detection region in a second luminance-specific color coordinate plane, the resulting volume having the first and second detection regions as a top and bottom base.

Accordingly, a plurality of cross-sections of the resulting volume may be used to define a plurality of detection regions, each detection region being disposed in a distinct coordinate space and specific to a discrete luminance between the first and second luminance values in the luminance axis. In one embodiment, the relative position, size and/or orientation of a detection region with respect to the other detection regions comprising the detection volume may be variable along the luminance axis.

At step 507, a pixel having a color corresponding to a position in the detection volume constructed in step 501 is shifted to a second position to enhance the color of the pixel when displayed. The color data of the pixel is shifted such that the coordinates representing the color of the pixel as a position in the color coordinate plane is modified to correspond to an alternate position in the color coordinate plane. In one embodiment, the alternate position is a pre-defined position in a shift volume. For example, a pixel having a position within a detection region will have its coordinates modified to represent the position, in a shift region associated with the detection region, which corresponds to the specific position in the detection region.

In one embodiment, a shift volume corresponding to the detection volume is constructed along the same luminance axis for the same three dimensional color space. The shift volume may be interpolated from a first defined shift region in the first luminance-specific color coordinate plane and a second defined shift region in the second luminance-specific color coordinate plane. The shift volume may be interpolated by linearly coupling a plurality of points along the perimeter of the first shift region and the second shift region, wherein the resulting volume, bounded by the first and second shift regions, form the shift volume.

A plurality of luminance-specific shift regions may be thus defined from cross-sections of the resulting shift volume for the plurality of luminance values between the first and second luminance values in the luminance axis. In one embodiment, the relative position, size and/or orientation of a shift region with respect to the other shift regions comprising the shift volume may be variable along the luminance axis. In further embodiments, the relative position, size and/or orientation of a shift region with respect to the corresponding detection region may be variable along the luminance axis.

In one embodiment, each detection region in a detection volume has a corresponding shift region in a shift volume. Specifically, each discrete position in a detection region corresponds to a specific discrete position in the corresponding shift region. In further embodiments, each discrete position in a detection region is pre-mapped to another, luminance-specific position in a shift region. A discrete position in a detection region may be pre-mapped to a position in a corresponding shift region by, for example, correlating the position in the detection region with respect to the entire detection region to a position in the shift region having the same relative position with respect to the shift region. In further embodiments, a shift region corresponding to a detection region is disposed in the same luminance-specific color coordinate plane wherein the detection region is disposed. In still further embodiments, the magnitude and direction of the resultant "shift" from a position in the detection region to the corresponding position in the shift region may also be luminance-specific, and variable for detection regions and shift regions disposed in color-coordinate planes specific to other luminance values in the luminance axis.

At step 509, the pixel of the frame (e.g., image frame or still frame of a video) is displayed as the color corresponding to the color data of the pixel. The color data may be displayed as modified according to step 507, or, if undetected in step 505, the color data may be displayed according to the originally received color data.

Figure 6:
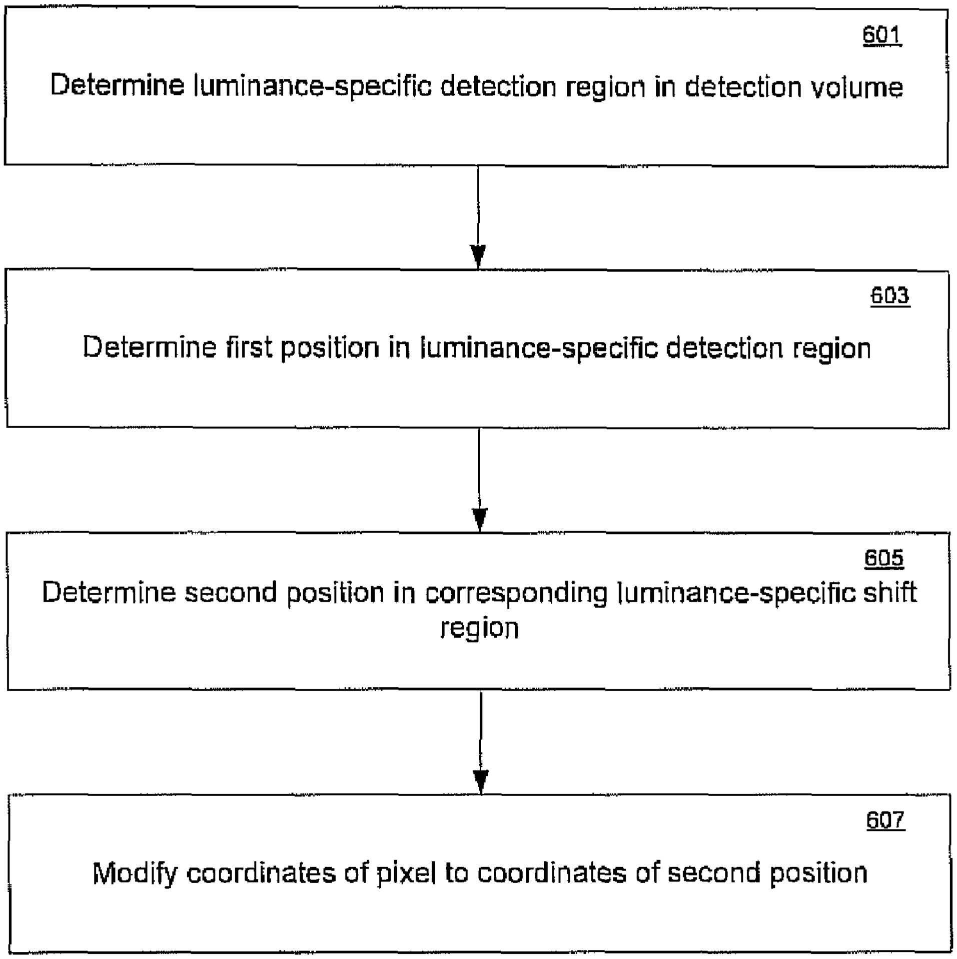
FIG. 6 depicts a flowchart of an exemplary process for shifting color data for a pixel in a display, in accordance with embodiments of the present invention.

With reference to FIG. 6, a flowchart of an exemplary computer implemented process 600 for shifting color data for a pixel in a display is depicted, in accordance with various embodiments. Steps 601-607 describe exemplary steps comprising the process 600 in accordance with the various embodiments herein described. In one embodiment, process 600 comprises the steps performed during step 509 as described with reference to FIG. 5.

The specific detection region of a detection volume, wherein the color data of a pixel is detected, is determined at step 601. In one embodiment, the detection region is a color coordinate plane corresponding to the discrete luminance value included in the color data of the pixel. In some embodiments, determining a detection region comprises referencing the detection region in a color coordinate plane corresponding to the given luminance value. For example, the detection region may be determined by determining the cross-section of the detection volume disposed in the color-coordinate plane corresponding to the given luminance value.

At step 603, the position (a "first position") of the pixel in the detection region is determined. The location in the detection region may comprise, for example, the position in the color coordinate plane corresponding to the set of coordinates included in the color data of the pixel.

At step 605, the position (a "second position") of the pixel in the shift region corresponding to the position of the first position in the detection region is determined. Thus, a pixel translated to have a position equal to the first position will be shifted (e.g., by adjusting the chromatic values comprising the color data of the pixel) to the second position. In one embodiment, the position in the shift region may be pre-mapped. In alternate embodiments, the position in the shift region may be determined dynamically by juxtaposing a position in the shift region having the same relativity to other positions in the shift region as the first position with respect to the other positions in the detection region. In some embodiments, the shift region may comprise a bounded area in the same color coordinate plane as the detection region. In further embodiments, the relative displacement of the second position from the first position may be luminance-specific, and variable for other luminance values in the luminance axis.

At step 607, the coordinates of the color data of the pixel are modified to correspond to the second position, the modification comprising a displacement from the original, first position of the color data to a desired color-enhanced position.

Volume Construction

Figure 7:
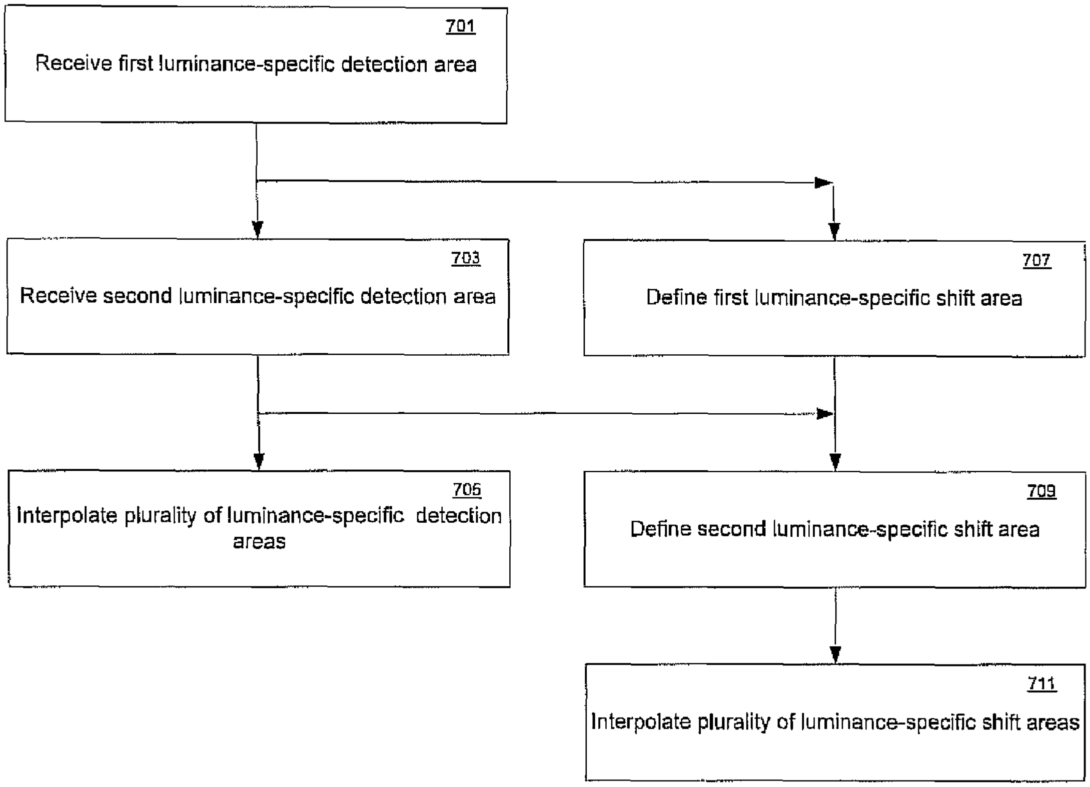
FIG. 7 depicts a flowchart of an exemplary process for constructing a detection volume and a shift volume, in accordance with embodiments of the present invention.

With reference to FIG. 7, a flowchart of an exemplary computer implemented process 700 for constructing a detection volume and a shift volume is depicted, in accordance with various embodiments. Steps 701-711 describe exemplary steps comprising the process 700 in accordance with the various embodiments herein described. Process 700 may be performed in, for example, a component in a color-image pipeline. In one embodiment, process 700 may be implemented as a series of computer-executable instructions.

At step 701, a first detection area in a first luminance-specific color coordinate plane is received. The first detection area may be pre-defined and retrieved from a storage component, or dynamically defined and received as input from an external source (e.g., a user). In one embodiment, the first detection area is a bounded region in a color coordinate plane specific to a first luminance in a color space. In further embodiments, the color space is a YCbCr color space. In still further embodiments, the bounded region is shaped as a geometric shape.

At step 703, a second detection area in a second luminance-specific color coordinate plane is received specific to a second luminance in the color space.

At step 705, a plurality of detection regions is interpolated from the first detection area and the second detection area. The plurality of detection regions may be interpolated by, for example, linearly interpolating a plurality of detection regions disposed in a plurality of luminance-specific color coordinate planes comprising the intervening color space between the first luminance-specific color-coordinate plane and the second luminance-specific color coordinate plane. The plurality of detection regions is subsequently combined to form a detection volume.

At step 707, a first shift area is defined in the same luminance-specific color coordinate plane comprising the first detection area. The first shift area corresponds to the first detection area and may be pre-mapped to the first detection area and retrieved from a storage component, or dynamically defined and mapped from input from an external source (e.g., a user). In one embodiment, the first shift area is a bounded region corresponding to the first detection area in the luminance-specific color coordinate plane specific to the first luminance in the color space. In one embodiment, the first shift area assumes a geometric shape similar to the shape of the first detection area. In further embodiments, the size, orientation and position relative to the first detection area may be adjusted.

At step 709, a second shift area is defined in the same luminance-specific color coordinate plane comprising the second detection area. The second shift area corresponds to the second detection area.

At step 711, a plurality of shift regions is interpolated from the first shift area and the second shift area. The plurality of shift regions may be interpolated by, for example, linearly interpolating a plurality of shift regions disposed in the plurality of luminance-specific color coordinate planes comprising the intervening color space between the first shift area and the second shift area. The plurality of detection regions is subsequently combined to form a shift volume which corresponds to the detection volume. Subsequently received input detected in a detection region in the detection volume constructed at step 705 will be shifted (e.g., a displacement in the color coordinate plane will be executed) for the portion of input into the shift region corresponding to the detection region and comprised in the shift volume constructed at step 711.

In one embodiment, the detection volume and/or the shift volume is variable along the luminance axis. Thus, subsequent modifications (including additions) to either a luminance-specific detection region in the detection volume or a luminance-specific shift region in the shift volume may be automatically extrapolated to each of the other luminance-specific regions (e.g., detection or shift) in the affected volume.

Color Enhancement System

Figure 8:
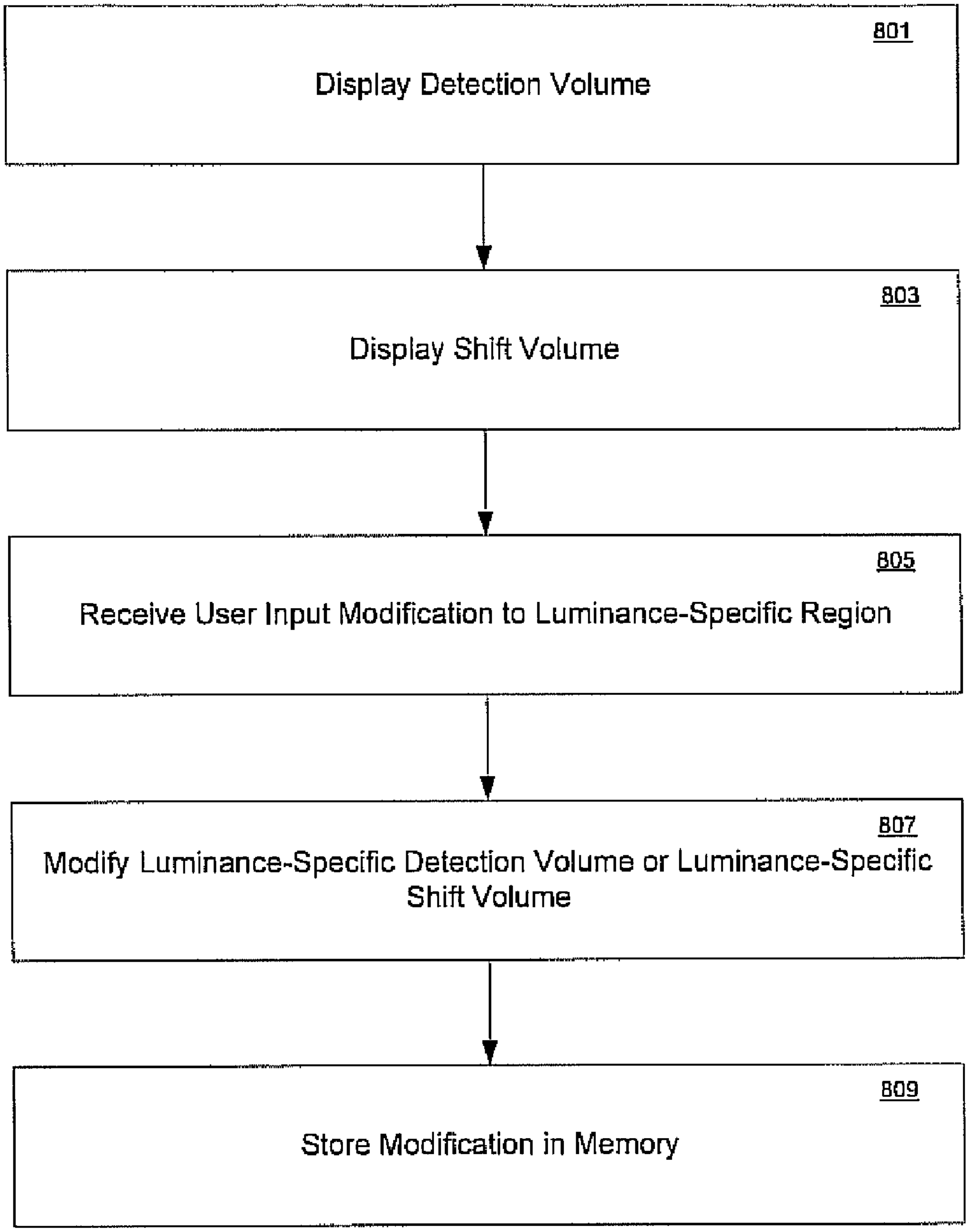
FIG. 8 depicts a flowchart of an exemplary process for providing color enhancement from an interface on a display, in accordance with embodiments of the present invention.

With reference to FIG. 8, a flowchart of an exemplary process 800 for providing color enhancement from an interface on a display is depicted, in accordance with various embodiments. Steps 801-809 describe exemplary steps comprising the process 800 in accordance with the various embodiments herein described. Process 800 may be performed in, for example, a component in a color-image pipeline. In one embodiment, process 800 may be implemented as a series of computer-executable instructions.

At step 801, a detection volume in a color space is displayed. In one embodiment, the detection volume displayed in the color space may correspond to a default set of values. Alternatively, the detection volume may comprise a set of values previously stored by a user. The detection volume may be displayed in, for example, a graphical user interface in an application for providing color enhancement functionality. In one embodiment, the detection volume may be displayed as a three dimensional object in a color space formed from the combination of a plurality of two dimensional shapes along a luminance axis, functioning as the third dimensional component of the three dimensional volume. In a further embodiment, each of the two dimensional color-coordinate planes is specific to a luminance value in the luminance axis.

In alternate embodiments, a specific luminance in the luminance axis may be selected, and the color coordinate plane and detection region disposed in the color coordinate plane specific to the specific luminance may be displayed independently of the rest of the detection volume. In further embodiments, detection volume may be displayed as a graph (e.g., line graph, bar graph, etc. . . . ) displaying the position of a detection region in a luminance-specific color coordinate plane relative to detection regions in the detection volume specific to alternate luminance values At step 803, a shift volume corresponding to the detection volume in a color space is displayed. In one embodiment, the shift volume may be displayed in the same display or interface and according to the same representation (e.g., three dimensional color space, or as a series of two dimensional color-coordinate plane) as the detection volume. In one embodiment, the shift volume displayed in the color space may correspond to a default set of values. Alternatively, the shift volume may comprise a set of values previously stored by a user. In alternate embodiments, the shift volume may be displayed in any like fashion described above with reference to the display of the detection volume. In some embodiments, step 803 may be performed simultaneously with step 801.

At step 805, user input is received from an interface on the display. The user input may comprise, for example, a modification to the luminance-specific detection region in the detection volume displayed in step 801, or a modification to the luminance-specific shift region in the shift volume displayed in step 803. A modification may comprise, for example, adjusting a size, shape, orientation, or location in the luminance-specific color coordinate plane of a detection region or a shift region.

At step 807, the volume (e.g., detection volume and/or shift volume), comprising the region (e.g., detection region or shift region) modified in response to user input in step 805, is adjusted to correspond to the user input received. Adjusting a volume may comprise, for example, re-interpolating the luminance-specific regions comprising the volume, including the modified region. Thus, an adjusted volume may be adjusted along a luminance axis, wherein the corresponding detection and shift functionality, where appropriate, is variable along the luminance axis. After the adjustment is performed, the display of the adjusted volume is also modified to display the modification.

At step 809, the user input modification and resultant modified volume is stored in a storage component, such as a memory, coupled to the graphical user interface. In one embodiment, subsequent graphical inputs (e.g., image frames, still frames of a video, etc. . . . ) are compared to the detection volume and shifted into the shift volume according to the luminance-specific shift parameter, including any modifications made thereto.

Exemplary Computing Device

Figure 9:
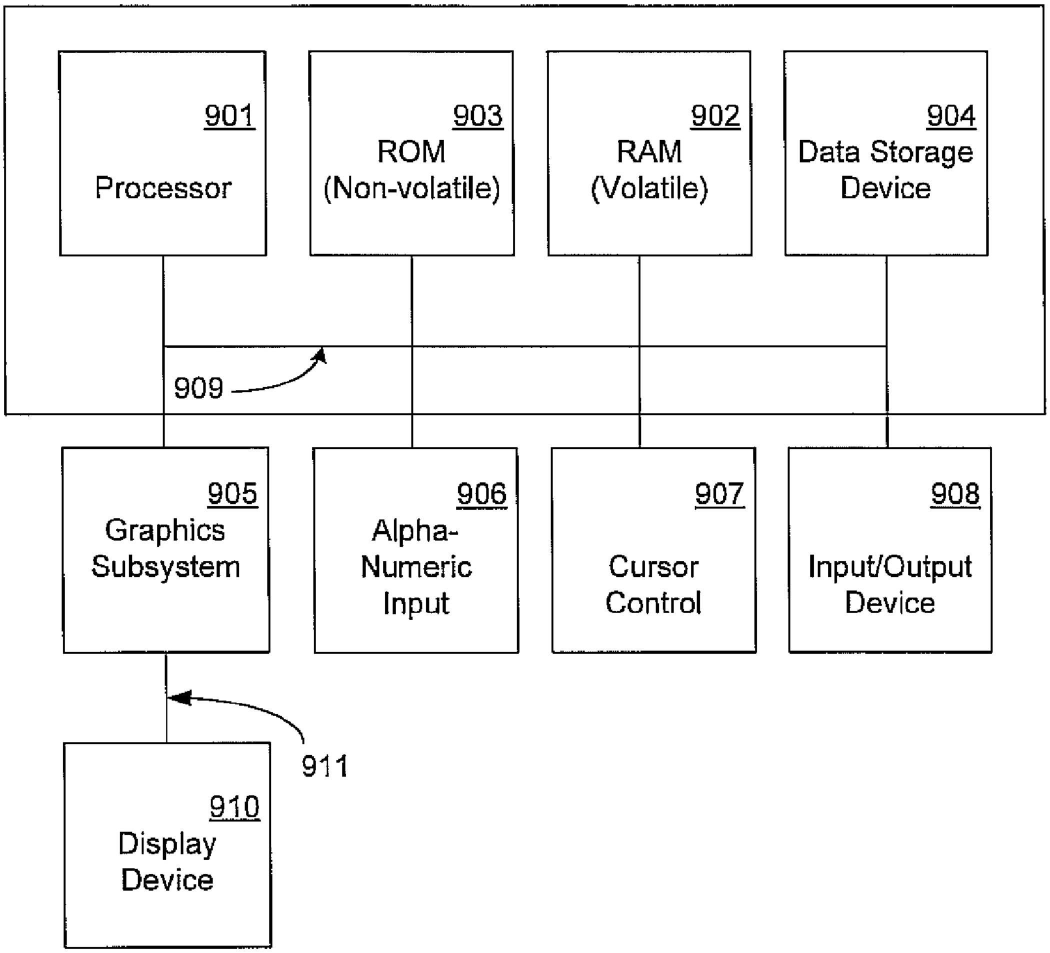
FIG. 9 depicts a block diagram of an exemplary computer controlled display device which may serve as a platform for various embodiments of the present invention.

With reference to FIG. 9, a block diagram of an exemplary computer controlled display 900 is shown. It is appreciated that computer system 900 described herein illustrates an exemplary configuration of an operational platform upon which embodiments may be implemented. Nevertheless, other computer systems with differing configurations can also be used in place of computer system 900 within the scope of the present invention. That is, computer system 900 can include elements other than those described in conjunction with FIG. 9. Moreover, embodiments may be practiced on any system which can be configured to enable it, not just computer systems like computer system 900.

It is understood that embodiments can be practiced on many different types of computer system 900. Examples include, but are not limited to, desktop computers, workstations, servers, media servers, laptops, gaming consoles, digital televisions, PVRs, and personal digital assistants (PDAs), as well as other electronic devices with computing and data storage capabilities, such as wireless telephones, media center computers, digital video recorders, digital cameras, and digital audio playback or recording devices.

As presented in FIG. 9, an exemplary system for implementing embodiments includes a general purpose computing system environment, such as computing system 900. In its most basic configuration, computing system 900 typically includes at least one processing unit 901 and memory, and an address/data bus 909 (or other interface) for communicating information. Depending on the exact configuration and type of computing system environment, memory may be volatile (such as RAM 902), non-volatile (such as ROM 903, flash memory, etc.) or some combination of the two. Computer system 900 may also comprise an optional graphics subsystem 905 for presenting information to the computer user, e.g., by displaying information on an attached display device 910, connected by a video cable 911. In one embodiment, process 500, 600, 700 and/or process 800 may be performed, in whole or in part, by graphics subsystem 905 and displayed in attached display device 910.

Additionally, computing system 900 may also have additional features/functionality. For example, computing system 900 may also include additional storage (removable and/or non-removable) including, but not limited to, magnetic or optical disks or tape. Such additional storage is illustrated in FIG. 9 by data storage device 904. Computer storage media includes volatile and nonvolatile, removable and non-removable media implemented in any method or technology for storage of information such as computer readable instructions, data structures, program modules or other data. RAM 902, ROM 903, and data storage device 904 are all examples of computer storage media.

Computer system 900 also comprises an optional alphanumeric input device 906, an optional cursor control or directing device 907, and one or more signal communication interfaces (input/output devices, e.g., a network interface card) 908. Optional alphanumeric input device 906 can communicate information and command selections to central processor 901. Optional cursor control or directing device 907 is coupled to bus 909 for communicating user input information and command selections to central processor 901. Signal communication interface (input/output device) 908, which is also coupled to bus 909, can be a serial port. Communication interface 909 may also include wireless communication mechanisms. Using communication interface 909, computer system 900 can be communicatively coupled to other computer systems over a communication network such as the Internet or an intranet (e.g., a local area network), or can receive data (e.g., a digital television signal).

Although the subject matter has been described in language specific to structural features and/or processological acts, it is to be understood that the subject matter defined in the appended claims is not necessarily limited to the specific features or acts described above. Rather, the specific features and acts described above are disclosed as example forms of implementing the claims.

What is claimed is:

1. A method of color enhancement using a detection volume and a shift volume, said method performed on a computing device, and comprising:

receiving color data for a plurality of pixels, color data for a pixel comprising a luminance value and a set of chromatic values;

translating a set of chromatic values for a pixel into a first position in a color coordinate plane, said color coordinate plane corresponding to said luminance value;

comparing said first position of said pixel to said detection volume;

shifting said first position of said pixel to a second position if said first position is detected in said detection volume, said second position comprised in a shift volume, wherein said detection volume and said shift volume are variable along a luminance axis; and displaying said plurality of pixels.

2. The method according to claim 1, further comprising:

constructing said detection volume by interpolating a detection volume from a first detection region having a first luminance value and a second detection region having a second luminance value, said detection volume comprising said first detection region, said second detection region, and a plurality of detection regions having a plurality of luminance values between said first luminance value and said second luminance value; and constructing said shift volume by interpolating a shift volume from a first shift region having said first luminance value and a second shift region having said second discrete luminance, said shift volume comprising said first shift region, said second shift region, and a plurality of shift regions having said plurality of luminance values.

3. The method according to claim 1, wherein shifting a first position of a pixel in said plurality of pixels comprises:

determining a detection region in said detection volume comprising an equivalent luminance value with said luminance value corresponding to said pixel;

determining a location of said first position in said detection region corresponding to said set of coordinates in said color coordinate plane of said color data;

determining the location of said second position in a shift region corresponding to said detection region; and modifying said set of coordinates to represent said second position, wherein said second position comprises a displacement in said color coordinate plane from said first position.

4. The method according to claim 1, wherein:

a detection region comprised in said detection volume comprises a first plurality of positions in a color coordinate plane for a luminance value; and a shift region comprised in said shift volume comprises a second plurality of positions in a color coordinate plane for said luminance value.

5. The method according to claim 1, wherein:

a detection region for a luminance value comprised in said detection volume has a corresponding shift region comprised in said shift volume for the same luminance value; and a position in said detection region has a corresponding position in said shift region, said corresponding position comprising a displacement in a color coordinate plane from said position in said detection region.

6. The method according to claim 5, wherein a shift region comprised in said shift volume for a luminance value is arranged in a geometric shape that is similar to a geometric shape of a corresponding detection region comprised in said detection volume for said luminance value.

7. The method according to claim 1, wherein a size of a luminance-specific detection region comprised in said detection volume is variable relative to a size of a luminance-specific shift region comprised in said shift volume along a luminance axis.

8. The method according to claim 7, wherein a size of a detection region is variable relative to a size of a shift region corresponding to said detection region along said luminance axis.

9. The method according to claim 5, wherein a directional orientation of a shift region for a luminance value comprised in said shift volume is variable from a directional orientation of a corresponding detection region for said luminance comprised in said detection volume.

10. A method for constructing a detection volume and a shift volume for color enhancement, said method performed in a computing device, and comprising:

receiving a first detection area in a first color coordinate plane;

receiving a second detection area in a second color coordinate plane;

defining a first shift area in said first color coordinate plane, said first shift area corresponding to said first detection area;

defining a second shift area in said second color coordinate plane, said second shift area corresponding to said second detection area;

interpolating, from said first detection area and said second detection area, a plurality of detection areas disposed in a plurality of color coordinate planes, said plurality of detection areas constructing a detection volume; and interpolating, from said first shift area and said second shift area, a plurality of shift areas disposed in said plurality of color coordinate planes, constructing a shift volume, wherein said detection volume and said shift volume are variable along a luminance axis.

11. The method according to claim 10, further comprising:

receiving a third detection area disposed in a third color coordinate plane, said third coordinate plane corresponding to a third discrete luminance between a first discrete luminance corresponding to said first detection area and a second discrete luminance corresponding to said second detection area in a luminance axis; and defining a third shift area, said third shift area disposed in said third color coordinate plane and corresponding to said third detection area.

12. The method according to claim 11, wherein constructing said detection volume further comprises:

interpolating, from said first detection area, said second detection area and said third detection area:

a first set of detection areas disposed in said plurality of detection areas, said first set of detection areas corresponding to a first plurality of discrete luminance between said first discrete luminance and said third discrete luminance;

a second set of detection areas disposed in said plurality of detection areas, said second set of detection areas corresponding to a second plurality of discrete luminance between said third discrete luminance and said second discrete luminance; and aggregating said first set of detection areas and said second set of detection areas to form said detection volume.

13. The method according to claim 12, wherein constructing a shift volum comprises:

interpolating, from said first shift area, said second shift area and said third shift area:

a first set of shift areas disposed in said plurality of shift areas, said first set of shift areas corresponding to said first plurality of discrete luminance between said first discrete luminance and said third discrete luminance;

a second set of shift areas disposed in said plurality of shift areas, said second set of shift areas corresponding to said second plurality of; and aggregating said first set of shift areas and said second set of shift areas to form said shift volume.

14. The method according to claim 10, wherein, defining a first shift area comprises defining a first shift area having a first displacement relative to said first detection area, defining a second shift area comprises defining a second shift area having a second displacement relative to said first detection area.

15. The method according to claim 14, wherein said first displacement relative to said first detection area variable from said second displacement relative to said second detection area.

16. In a computer system having a graphical user interface including a display and a user interface selection device, a method of providing color enhancement from an interface on the display, comprising:

displaying a detection volume comprising a plurality of detection regions disposed in a plurality of color coordinate planes, said plurality of color coordinate planes corresponding to an axis of discrete luminance;

displaying a shift volume comprising a plurality of shift regions disposed in a plurality of color coordinate planes, said plurality of color coordinate planes corresponding to an axis of discrete luminance;

receiving an input from said interface on said display, said input indicative of a modification to a detection region comprised in said detection volume and a modification to a shift region comprised in said shift volume;

modifying said detection volume and said shift volume to correspond to said input; and storing said input in a memory.

17. The system according to claim 16, wherein said modifying of said detection volume comprises interpolating said modification to said detection region throughout said detection volume.

18. The system according to claim 16, wherein said modifying of said detection volume comprises interpolating said modification to said shift region throughout said shift volume.

19. The system according to claim 16, wherein said display displays said detection volume and said shift volume.

20. The system according to claim 16, wherein said display displays a color coordinate plane comprising a detection region comprised in said detection volume and a shift region comprised in said shift volume for a discrete luminance.

* * * * *